United States Patent [19]
Joo

[11] Patent Number: 6,084,812
[45] Date of Patent: Jul. 4, 2000

[54] DEVICE AND METHOD FOR VARYING BIT LINE PRECHARGE VOLTAGE IN SEMICONDUCTOR MEMORY

[75] Inventor: Yang Sung Joo, Seoul, Rep. of Korea

[73] Assignee: LG Semicon Co., Ltd., Chungcheongbuk-Do, Rep. of Korea

[21] Appl. No.: 09/296,492

[22] Filed: Apr. 22, 1999

[30] Foreign Application Priority Data

May 19, 1998 [KR] Rep. of Korea ............... 98-18003

[51] Int. Cl.$^7$ ............................................. G11C 7/00
[52] U.S. Cl. ........................................ 365/222; 365/203
[58] Field of Search .................................. 365/222, 203, 365/211, 189.09

[56] References Cited

U.S. PATENT DOCUMENTS

| | | | |
|---|---|---|---|
| 4,547,867 | 10/1985 | Reese et al. .................. | 365/189 |
| 4,716,551 | 12/1987 | Inagaki ........................ | 365/222 |
| 4,816,706 | 3/1989 | Dhong et al. . | |
| 5,257,232 | 10/1993 | Dhong et al. ................. | 361/203 |
| 5,339,279 | 8/1994 | Toms et al. ................... | 365/185 |
| 5,375,093 | 12/1994 | Hirano ......................... | 365/222 |
| 5,532,968 | 7/1996 | Lee ............................. | 365/222 |
| 5,903,506 | 5/1999 | Blodgett ...................... | 365/222 |

*Primary Examiner*—Richard Elms
*Assistant Examiner*—Anh Phung
*Attorney, Agent, or Firm*—Morgan, Lewis & Bockius LLP

[57] ABSTRACT

Device and method for varying a bit line precharge voltage in a semiconductor memory, in which the bit line precharge voltage is varied with a chip temperature for improving a refresh characteristic, reducing a power consumption, the device including a temperature detector for detecting a change of a chip temperature of the semiconductor memory, a bit line precharge voltage generator for varying and forwarding the bit line precharge voltage in response to a temperature detection signal provided from the precharge voltage generator, and a sensing unit for receiving the bit line precharge voltage provided from the precharge voltage generator and sensing a data from the memory cell, the method including the steps of detecting a change of a chip temperature of the semiconductor memory, and dropping the bit line precharge voltage before forwarding the bit line precharge voltage if the chip temperature of the semiconductor memory is higher than a preset temperature.

5 Claims, 5 Drawing Sheets

DEVICE AND METHOD FOR VARYING BIT LINE PRECHARGE VOLTAGE IN SEMICONDUCTOR MEMORY

BACKGROUND OF THE INVENTION

1. Field of the Invention

The present invention relates to a device and method for varying a bit line precharge voltage in a semiconductor memory, and more particularly, to a device and method for varying a bit line precharge voltage in a semiconductor memory, in which the bit line precharge voltage is varied with a chip temperature for improving a refresh characteristic, reducing power consumption.

2. Background of the Related Art

FIG. 1 illustrates a circuit showing a system of a related art DRAM.

Referring to FIG. 1, the related art DRAM is provided with a cell array unit 10 having word lines WLi and WLj each for applying an address signal thereto in input/output of a data to/from the DRAM, bit lines Bl and bit bar lines BLb each for input/output of the data, cell capacitors C1 and C2 for storing the data thereto, and transistors MN1 and MN2 adapted to be turned on/off in response to the address signal on the word lines WLi and WLj for reading/recording the data from/in the cell capacitors C1 and C2 through the bit lines Bl and bit bar lines Blb, a sense amplifier 20 for sensing and amplifying the data stored in each cell in the cell array unit 10 and provided through the bit lines, a driving unit 30 for providing a driving signal to the sense amplifier 20 for improving a sensitivity of the sense amplifier 20, and a data output circuit(not shown) for receiving the data from the sense amplifier 20 through the bus lines (not shown), amplifying at a given amplification ratio, and forwarding to outside of the DRAM.

The operation of the aforementioned related art DRAM will be explained. FIG. 2 illustrates a waveform showing changes of level of a $V_{DD}$ voltage provided to the memory cell array. Of the basic operations of write, read, and refresh of the DRAM, the read operation is proceeded as follows.

Upon reception of, for example, an address signal, since a word line WL for the address signal is selected to bootstrap the WL to a high voltage and turn on the transistor MN1 connected to the selected word line WL, a cell data stored in the cell capacitor C1 is moved to the bit line BL. Then, the sense amplifier 20 senses and amplifies the data, and transfers to the data bus line. Eventually, the data output circuit (not shown in FIG. 1) receives the data from the bus line, amplifies to a given amplification ratio, and forwards to outside of the DRAM.

The foregoing operation will be explained further in detail.

Referring to FIG. 2, a VBLP(Bit Line Precharge Voltage) and a VCP(Cell Plate Voltage) are $\frac{1}{2}V_{DD}$, respectively. Therefore, upon a word line WL is selected in response to an address signal, the selected word line WLi is enable at a high voltage. When the word line WL is enabled, turning on the transistor MN1 connected to the enabled word line WLi, a parasitic capacitor Cb of the bit line and the cell capacitor C1 make charge sharing through the turned on transistor MN1. If it is assumed that the cell capacitor C1 is in storage of a $V_{DD}$ level voltage which is data "1", a level of the bit line BL becomes higher than a level of the bit bar line BLb by $\Delta Vb1$ as expressed in equation (1), below. Opposite to this, if the cell capacitor C1 is in storage of data "0", the level of the bit line BL becomes lower than a level of the bit bar line BLb by $\Delta Vb0$ as expressed in equation (2), below. Therefore, from equations (1) and (2) and VBLP is $\frac{1}{2}V_{DD}$ as expressed in equation (3), it can be known from equation (4) that an absolute value of a variation of the level of the bit line is equal, according to "1" or "0" of the cell data.

If the cell data is $V_{DD}$, $$\Delta Vb1=[C1/Cb*V_{DD}-C1/Cb*VBLP]/(1+C1/Cb) \quad (1)$$

On the other hand, if the cell data is "0", $$\Delta Vb0=-(C1/Cb*VBLP)/(1+C1/Cb) \quad (2)$$

$$VBLP=V_{DD}/2 \quad (3)$$

$$\Delta Vb1=-\Delta vb0 \quad (4)$$

Here, implications of the refresh operation will be explained. The data stored in a form of a charge in an isolated cell capacitor is diminished due to a leakage current caused by imperfect capacitor. Therefore, a repetitive process in which the stored data is read out, and the data is written again before complete extinction of the data is required, which is called as the refresh operation. The refresh operation should be executed before determination of the signal stored in the memory capacitor of being "1" or "0" becomes impossible due to excessive discharge of the signal charge, of which period is called a refresh period. And, a number representing times of a cycle in which entire rows of the DRAM are selected and refreshed is called a refresh cycle. A refresh interval is the refresh period divided by the refresh cycle. In an early stage of semiconductor device development, the refresh interval is substantially constant. However, as packing densities of the semiconductor devices become greater, with an increased number of bits which should be operated within one cycle period, a power consumption is increased.

In order to solve such problems, a related art device for controlling the refresh period as shown in FIG. 3 is suggested. FIG. 3 illustrates a block diagram of a related art device for controlling a refresh period, and FIG. 4 illustrates waveforms at different units in the device shown in FIG. 3.

Referring to FIG. 3, the related art device for controlling a refresh period is provided with a temperature detector 40 fitted on the chip for detecting a chip temperature and providing a detecting signal TMP-DET, a Vcc voltage detector 50 for detecting and forwarding a level of a constant voltage Vcc, a reset counter 70 for counting a PSRP (Programmable Self Refresh Pulse) clock signal and providing a signal of given bits for resetting the PSRP clock signal, and a rest signal controller 60 for receiving a signal from the reset counter 70, providing an ISRP (Internal Self Refresh Pulse) signal which determines a period of a reset signal according to the temperature detecting signal TMP-DET detected at the temperature detector 40 and the Vcc voltage detected value detected at the Vcc voltage detector 50, and providing a signal for resetting the reset counter 70.

The operation of the aforementioned related art device for controlling a refresh period will be explained.

As a retention time period of a cell data is relatively reduced in a case when a temperature is high or a Vcc is low in comparison to a case when the temperature is low or the Vcc is high, the refresh period of the chip is made faster, for preventing malfunction of the cell data. That is, it is assumed that the reset counter 70 counts PSRP and provides three bit of data of 000 to 111. The reset signal controller 60 determines the signal TMP-DET from the temperature detector 40 and the signal Vcc-DET from the Vcc voltage detector 50, to provide a reset signal when an output of the reset counter 70 is 111 in the case the chip temperature is low and the Vcc voltage is high, to provide the reset signal when the output of the reset counter 70 is 100 in the case the chip temperature is high or the Vcc voltage is low, and to provide the reset signal when the output of the reset counter 70 is 001 in the case the chip temperature is high and the Vcc voltage is also high. When the reset signal controller 60 is operative thus, at the end, the reset signal is provided in a period identical to the PSRP in the case the chip temperature is high and the Vcc is low, the reset signal is provided at every four PSRP pulses(because the reset signal is provided when the output of the reset counter is 100) in the case the chip temperature is high or the Vcc voltage is low, and the reset signal is provided at every seven PSRP pulses(because the reset signal is provided when the output of the reset counter is 111) in a normal case the chip temperature is low and the Vcc voltage is high.

However, the related art device for controlling a refresh period has the following problems.

Referring to FIG. 4, as the chip temperature is the higher or the Vcc voltage is the lower, the retention time period of the cell data is the shorter, and the retention time period of the cell data is the shorter as the level of data stored in the cell capacitor is the higher, rather than the lower. For example, it is assumed that a high data "1" and a low data "0" are varied at different rates in a turn off of the cell transistor and stored as Vc1 and Vc0, respectively. When develop voltages are obtained using charge sharing equations (1) and (2), it can be known that a size of $\Delta V1$ of the high data "1" is smaller than a size of $\Delta V0$ of the low data "0" according to the following equations.

If the cell data is $V_{DD} - \Delta 1 = Vc1$, $$\Delta Vb1 = [C1/Cb*\Delta Vc1 - C1/Cb*VBLP]/(1+C1/Cb) \quad (5)$$

On the other hand, if the cell data is $0 + \Delta 0 = Vc0$, $$\Delta Vb0 = [C1/Cb*Vc0 - C1/Cb*Vblp]/(1+C1/Cb) \quad (6)$$

If an absolute value of $\Delta 1$ is greater than an absolute value of $\Delta 0 (|\Delta 1| > |\Delta 0|)$, a relation of the equations (5) and (6) can be expressed with an inequality (7), below.

$$|\Delta Vb1| < |\Delta Vb0| \quad (7)$$

The inequality (7) implies that, as explained in association with the related art, if the data on the bit line is detected using ½ Vdd voltage, a refresh characteristic of the data can not but be asymmetric. And, varying the refresh period without taking the fact that the refresh period is asymmetric into consideration leads to consume a power more than necessary.

SUMMARY OF THE INVENTION

Accordingly, the present invention is directed to device and method for varying a bit line precharge voltage in a semiconductor memory that substantially obviates one or more of the problems due to limitations and disadvantages of the related art.

An object of the present invention is to provide device and method for varying a bit line precharge voltage in a semiconductor memory which can improve a refresh characteristic and drop a power consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the device for varying a bit line precharge voltage in a semiconductor memory having memory cells, word lines and bit lines, includes a temperature detector for detecting a change of a chip temperature of the semiconductor memory, a bit line precharge voltage generator for varying and forwarding the bit line precharge voltage in response to a temperature detection signal provided from the precharge voltage generator, and a sensing unit for receiving the bit line precharge voltage provided from the precharge voltage generator and sensing a data from the memory cell.

In other aspect of the present invention, there is provided a method for varying a bit line precharge voltage in a semiconductor memory having memory cells, word lines, and bit lines, including the steps of detecting a change of a chip temperature of the semiconductor memory, and dropping the bit line precharge voltage before forwarding the bit line precharge voltage if the chip temperature of the semiconductor memory is higher than a preset temperature.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
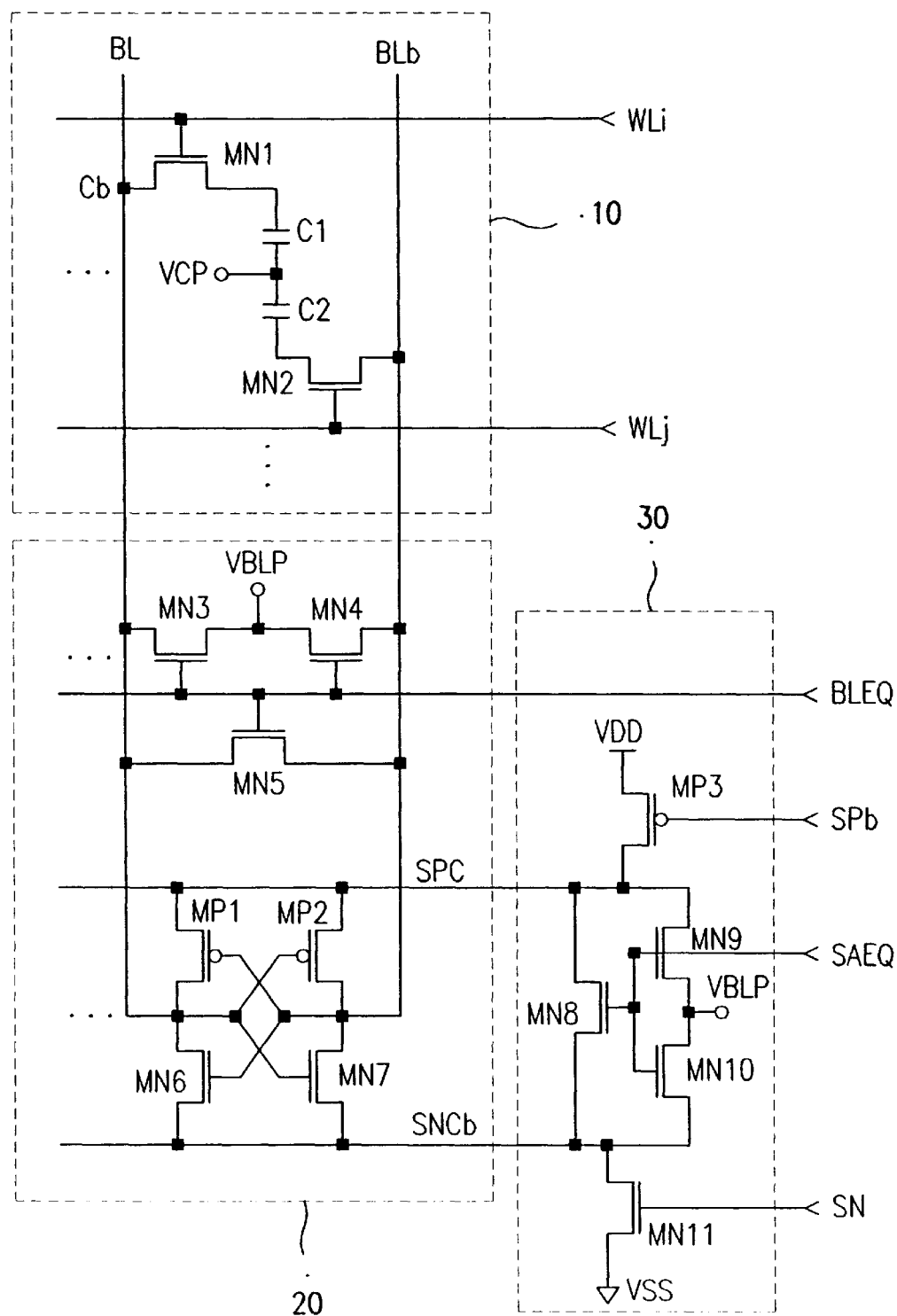
FIG. 1 illustrates a circuit showing a system of a prior art DRAM.
Figure 2:
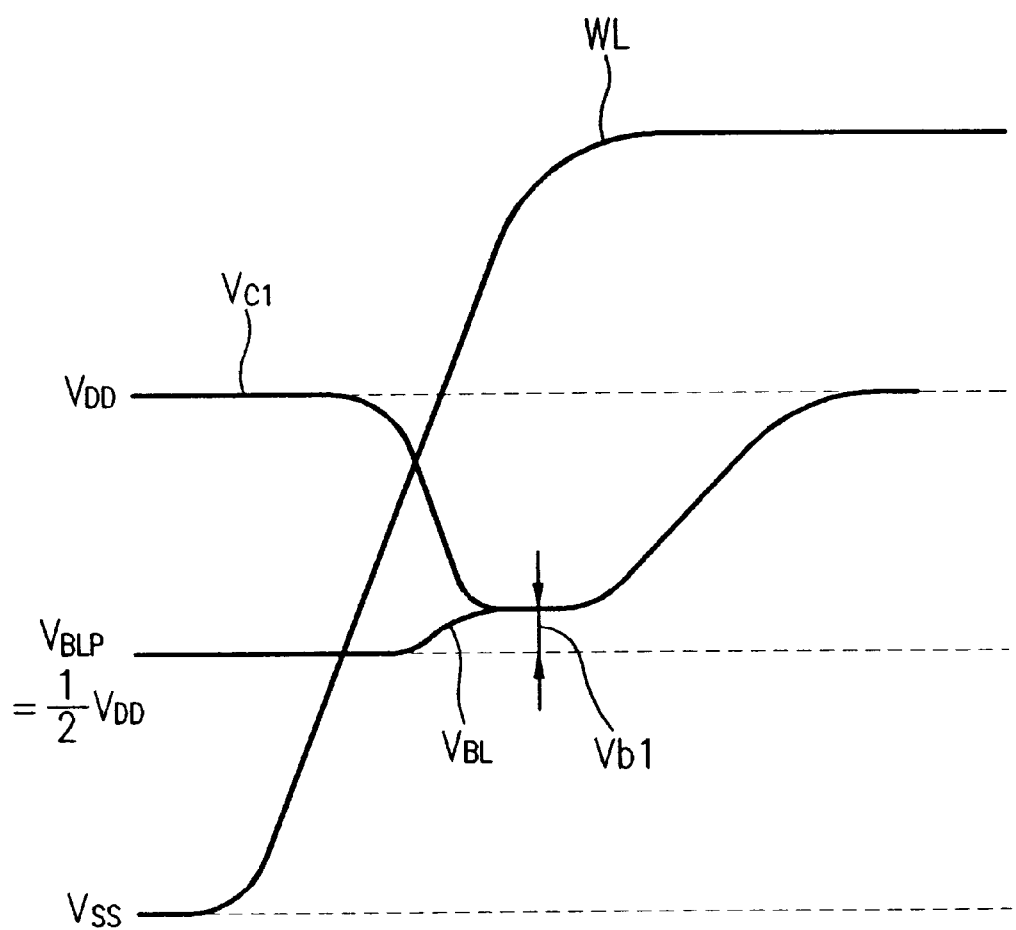
FIG. 2 illustrates a waveform showing changes of level of a $V_{DD}$ voltage provided to the memory cell array in FIG. 1.
Figures 3, 4:
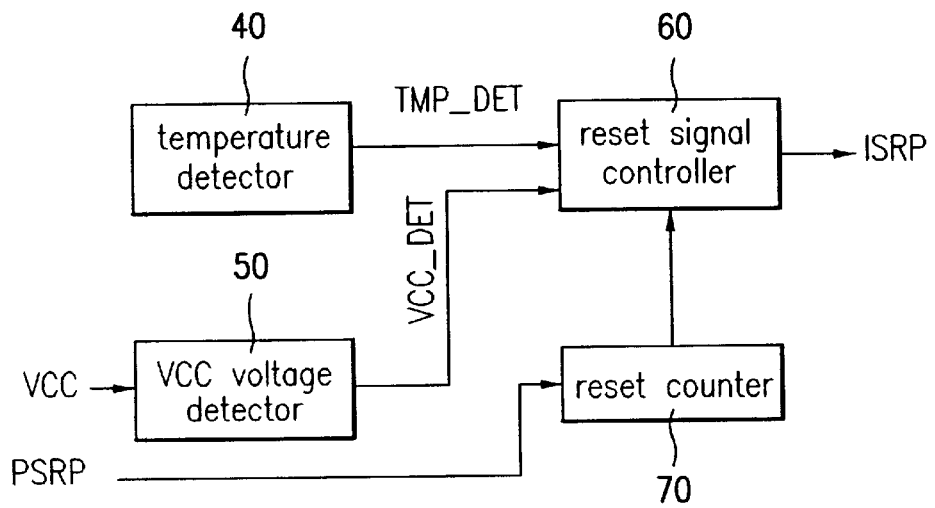
FIG. 3 illustrates a block diagram of a prior art device for controlling a refresh period.
FIG. 4 illustrates waveforms at different units in the device shown in FIG. 3.
Figure 5:
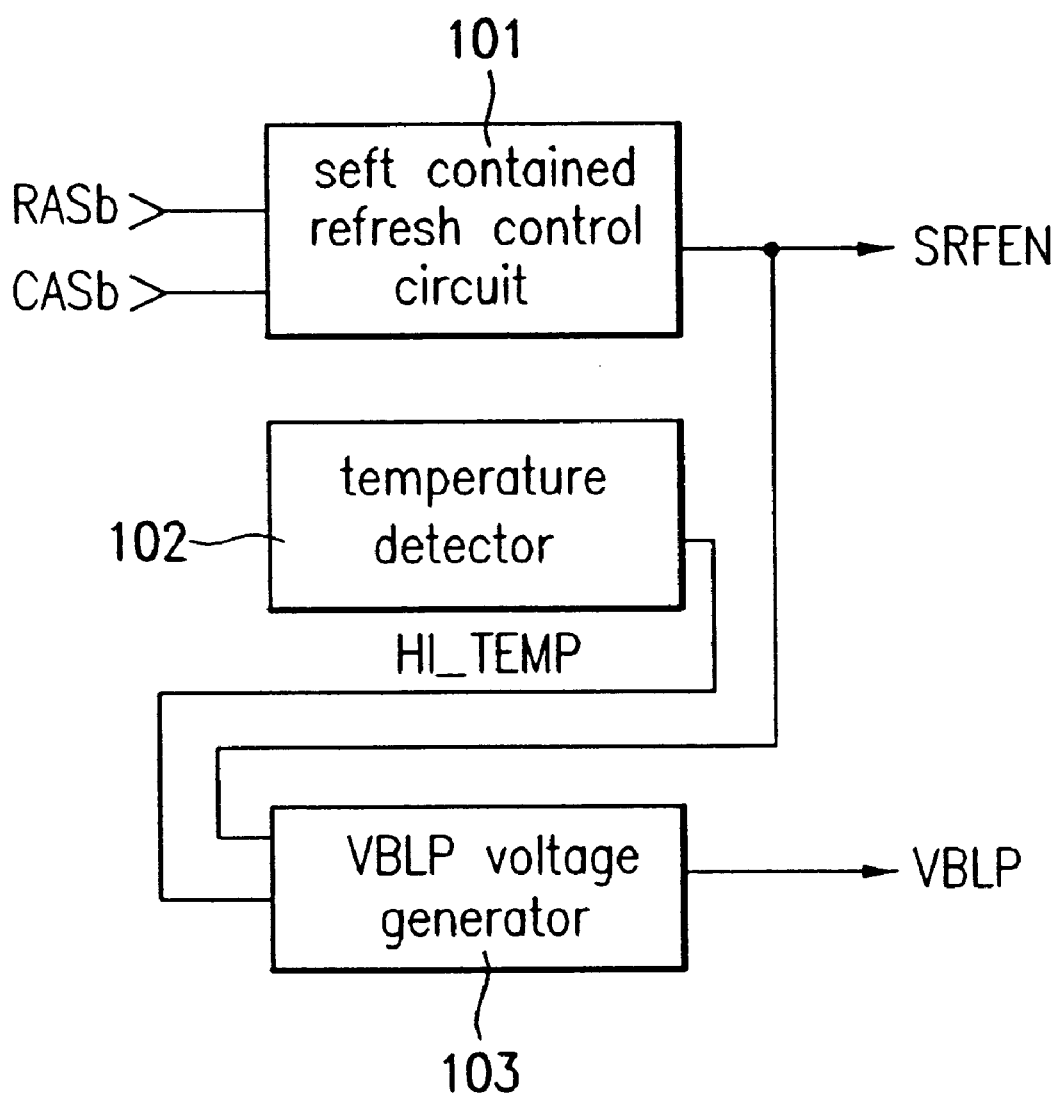
FIG. 5 illustrates a system of a device for varying a bit line precharge voltage in accordance with a preferred embodiment of the present invention; and, FIG. 6 illustrates the steps of a method for varying a bit line precharge voltage in accordance with a preferred embodiment of the present invention.
Figure 6:
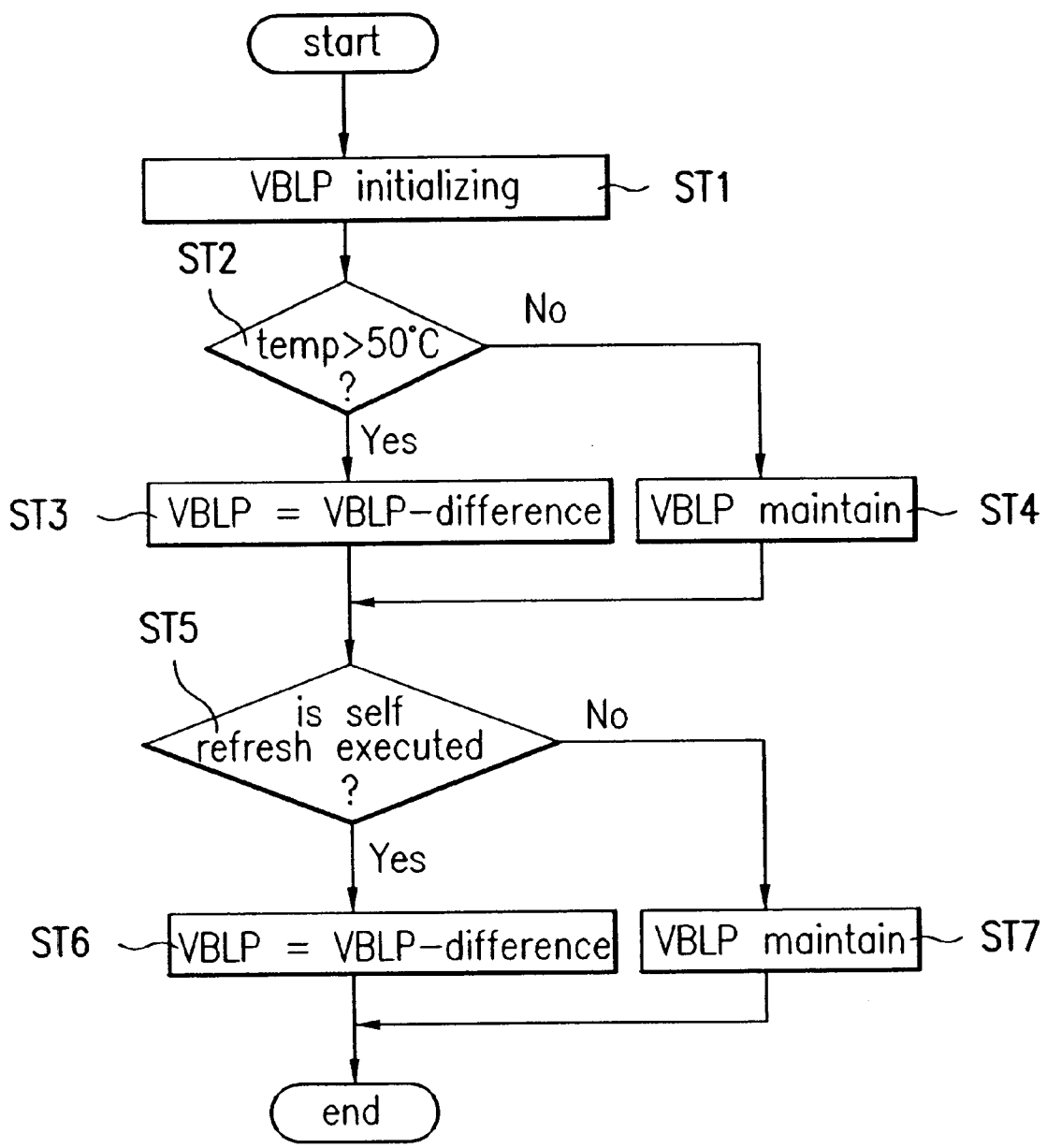

Reference will now be made in detail to the preferred embodiments of the present invention, examples of which are illustrated in the accompanying drawings. FIG. 5 illustrates a system of a device for varying a bit line precharge voltage in accordance with a preferred embodiment of the present invention, and FIG. 6 illustrates the steps of a method for varying a bit line precharge voltage in accordance with a preferred embodiment of the present invention.

Referring to FIG. 5, the device for varying a bit line precharge voltage in a semiconductor memory in accordance with a preferred embodiment of the present invention includes a self contained refresh control circuit 101 for providing a self refresh enable signal (SRFEN) in response to command signals, such as RAS(Row Address Strobe) bar RASb and CAS(Column Address Strobe) bar CASb, a temperature detector 102 for detecting a temperature change of a semiconductor memory chip, and VBLP voltage generator 103 for varying the bit line precharge voltage VBLP if a temperature detecting signal provided from the temperature detector 102 is higher than a preset value and varying the bit line precharge voltage VBLP once more if there is a refresh signal indicated by the self refresh enable signal (SRFEN) provided from the self contained refresh control circuit 101. In this instance, the VBLP voltage generator 103 drops the bit line precharge voltage further from the Vdd/2 if the chip temperature is higher than the preset temperature regardless of the refresh operation, and the VBLP voltage generator 103 lowers the bit line precharge voltage further once more if it is in the refresh mode.

The method for varying a bit line precharge voltage in accordance with a preferred embodiment of the present invention will be explained with reference to FIG. 6.

The method starts with initializing a bit line precharge voltage VBLP(ST1). The temperature detector 102 detects a chip temperature(ST2), to maintain the present bit line precharge voltage if the chip temperature is below a preset temperature(for example, 50° C.)(ST4) and, however, if the chip temperature detected at the temperature detector 102 is higher than the preset temperature(50° C.), to lower the present bit line precharge voltage by a value corresponding to the temperature(ST3). And, it is determined that whether the device for varying a bit line precharge voltage in a semiconductor memory is in a self refresh mode or not (ST5), to maintain the present bit line precharge voltage (ST7), if the device is not in the self refresh mode, and to lower the present bit line precharge voltage to a required voltage, if the device is in the self refresh mode(ST6). As explained, the temperature detector 102 provides an HI-TEMP signal to the VBLP voltage generator 103 if the chip temperature is higher than the preset temperature, so that the VBLP voltage generator 103 applies a VBLP level to a sense amplifier in a cell array in the memory chip in a VBLP'(=VBLP−ΔVblp) level which is lower than the VBLP level by a given level. And, also in the self refresh operation mode, a VBLP which is lower by a given level is provided to an inside of the chip.

Therefore, if the VBLP is varied with the retention time period characteristic of the "high" data and the "low" data as expressed in an equation (10) below, the retention time periods of the "high" data and the "low" data can be put equal as expressed in an equation (11), below.

If the cell data is $V_{DD}-\Delta 1=Vc1$, $$\Delta Vb1=[C1/Cb*\Delta Vc1-C1/Cb*(Vblp-\Delta vblp)]/(1+C1/Cb) \quad (8)$$

On the other hand, if the cell data is $0+\Delta 0=Vc0$, $$\Delta Vb0=[C1/Cb*Vc0-C1/Cb*(Vblp-\Delta vblp)]/(1+C1/Cb) \quad (9)$$

$$\text{If } |\Delta 1|=2*|\Delta 0|=4*|\Delta vblp| \quad (10)$$

$$|\Delta Vb1|=|\Delta Vb0| \quad (11)$$

Therefore, in the present invention, by dropping the VBLP level by Δvblp when the chip temperature is high, the refresh characteristic can be improved. And, if it is in the self refresh mode, as the refresh period can be the longer as the retention time period is the longer, the power consumption can be reduced substantially.

The device and method for varying a bit line precharge voltage in a semiconductor memory of the present invention has the following advantages.

First, by lowering the VBLP level by ΔVblp when the chip temperature is high, the retention time periods of the "high" data or the "low" data can be made equal.

Second, by making the retention time periods of the "high" data or the "low" data equal, the refresh characteristic can be improved.

Third, as the refresh period can be prolonged, the power consumption can be reduced, substantially.

It will be apparent to those skilled in the art that various modifications and variations can be made in the device and method for varying a bit line precharge voltage in a semiconductor memory of the present invention without departing from the spirit or scope of the invention. Thus, it is intended that the present invention cover the modifications and variations of this invention provided they come within the scope of the appended claims and their equivalents.

What is claimed is:

1. A device for varying a bit line precharge voltage in a semiconductor memory having memory cells, word lines and bit lines, comprising:

a temperature detector for detecting a change of a chip temperature of the semiconductor memory:

a bit line precharge voltage generator for varying and forwarding the bit line precharge voltage in response to a temperature detection signal provided from the precharge voltage generator; and, a sensing unit for receiving the bit line precharge voltage provided from the precharge voltage generator and sensing a data from the memory cell.

2. A device for varying a bit line precharge voltage in a semiconductor memory having memory cells, word lines and bit lines, comprising:

a self contained refresh control unit for providing a self refresh enable signal in response to a command signal to retain a data stored in the memory cell;

a temperature detector for detecting a change of a chip temperature of the semiconductor memory;

a bit line precharge voltage generator for varying and forwarding the bit line precharge voltage in response to a temperature detection signal provided from the precharge voltage generator and varying and forwarding the bit line precharge voltage in response to a refresh signal provided from the self contained refresh control unit; and, a sensing unit for receiving the bit line precharge voltage provided from the precharge voltage generator and sensing a data from the memory cell.

3. A method for varying a bit line precharge voltage in a semiconductor memory having memory cells, word lines, and bit lines, the method comprising the steps of:

detecting a change of a chip temperature of the semiconductor memory; and, dropping the bit line precharge voltage before forwarding the bit line precharge voltage if the chip temperature of the semiconductor memory is higher than a preset temperature.

4. A method as claimed in claim 3, further comprising the steps of:

providing a refresh signal in response to an external command signal; and, further dropping the bit line precharge voltage before forwarding the bit line precharge voltage in response to the refresh signal if it is in a refresh operation mode.

5. A method for varying a bit line precharge voltage in a semiconductor memory having memory cells, word lines, and bit lines, the method comprising the steps of:

initializing the bit line precharge voltage VBLP in the semiconductor memory;

detecting a temperature of the semiconductor memory and dropping the present bit line precharge voltage by a value corresponding to the temperature if the temperature is higher than a preset temperature; and, further dropping the present bit line precharge voltage before forwarding the bit line precharge voltage if it is in a refresh operation mode.

* * * * *